United States Patent
Gao

(10) Patent No.: US 9,914,294 B2
(45) Date of Patent: Mar. 13, 2018

(54) SCREEN ASSEMBLY, SCREEN PRINTING SYSTEM AND SCREEN PRINTING METHOD

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Zhiqiang Gao, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/803,151

(22) Filed: Jul. 20, 2015

(65) Prior Publication Data

US 2016/0263883 A1 Sep. 15, 2016

(30) Foreign Application Priority Data

Mar. 11, 2015 (CN) .......................... 2015 1 0106655

(51) Int. Cl.
*B41F 15/34* (2006.01)
*B41F 15/36* (2006.01)
(Continued)

(52) U.S. Cl.
CPC .......... *B41F 15/34* (2013.01); *B41F 15/0881* (2013.01); *B41N 1/24* (2013.01);
(Continued)

(58) Field of Classification Search
CPC ............ B41N 1/24; B41N 1/247; B41M 1/12; B41M 1/34; H05K 3/1225; B41F 15/34;
(Continued)

(56) References Cited

U.S. PATENT DOCUMENTS

| 6,641,669 B1 * | 11/2003 | Jiang ......................... B41C 1/14 |
| | | 118/301 |
| 2004/0026363 A1 * | 2/2004 | Akamatsu .............. H05K 3/007 |
| | | 216/13 |

(Continued)

FOREIGN PATENT DOCUMENTS

| CN | 102615952 A | 8/2012 |
| CN | 202528563 U | 11/2012 |

(Continued)

OTHER PUBLICATIONS

First Office Action for Chinese Application No. 201510106655.1 dated Aug. 2, 2016, and English Translation Thereof.

*Primary Examiner* — Jill Culler
*Assistant Examiner* — Marissa Ferguson Samreth
(74) *Attorney, Agent, or Firm* — Nath, Goldberg & Meyer; Joshua B. Goldberg

(57) ABSTRACT

The present invention provides a screen assembly, a screen printing system and a screen printing method, belonging to the field of screen printing technology, by means of which the problem of prior art that the printed pattern has unsmooth lines caused by deformation of a thin film screen after a plurality of times of printing can be solved. The screen assembly of the present invention comprises a thin film screen and a fixed screen both having a same pattern. When a packaging cover plate is printed, the thin film screen is arranged above the fixed screen, and the fixed screen is arranged on the packaging cover plate, so that the printing material passes through the thin film screen and the fixed screen successively to be printed onto the packaging cover plate. The screen assembly of the present invention is particularly applicable to the printing process of glass material.

7 Claims, 2 Drawing Sheets

(51) Int. Cl.
*H01L 51/52* (2006.01)
*H01L 51/56* (2006.01)
*B41N 1/24* (2006.01)
*H05K 3/12* (2006.01)
*B41F 15/08* (2006.01)
*B41M 1/12* (2006.01)
*B41M 1/34* (2006.01)

(52) U.S. Cl.
CPC .......... *B41N 1/247* (2013.01); *H01L 51/5246* (2013.01); *H01L 51/56* (2013.01); *H05K 3/1225* (2013.01); *B41M 1/12* (2013.01); *B41M 1/34* (2013.01)

(58) Field of Classification Search
CPC ... B41F 15/0881; H01L 51/56; H01L 51/5246
See application file for complete search history.

(56) References Cited

U.S. PATENT DOCUMENTS

| | | | | |
|---|---|---|---|---|
| 2013/0088670 A1* | 4/2013 | Lu | ............... | G02B 1/105 |
| | | | | 349/96 |
| 2013/0192480 A1* | 8/2013 | Abe | ............... | B41F 15/26 |
| | | | | 101/129 |

FOREIGN PATENT DOCUMENTS

| | | | | |
|---|---|---|---|---|
| CN | 104228323 A | | 12/2014 | |
| DE | 69515121 T2 | | 9/2000 | |
| JP | 03069532 A | * | 3/1991 | ........... C03C 255/02 |
| JP | 2012111222 A | | 6/2012 | |
| JP | 2015030162 A | | 2/2015 | |
| KR | 1020040089839 A | | 10/2004 | |

\* cited by examiner

SCREEN ASSEMBLY, SCREEN PRINTING SYSTEM AND SCREEN PRINTING METHOD

FIELD OF THE INVENTION

The present invention belongs to the field of screen printing technology, and particularly relates to a screen assembly, a screen printing system and a screen printing method.

BACKGROUND OF THE INVENTION

The organic light-emitting diode (OLED) display technology, as a novel flat panel display technology, has drawn increasing attention due to advantages of active emission, high brightness, wide view angle, quick response, low energy consumption, flexibility, etc., and has become a next generation of display technology that may substitute the liquid crystal display technology.

The existing OLED display panel contains an organic material layer that is quite sensitive to moisture and oxygen, and as a result, the service life of the OLED display panel is greatly reduced. In order to solve this problem, in the prior art, the organic material layer in the OLED display panel is isolated from the outside by using various kinds of material, so that the seal performance reaches the following standards: the amount of moisture penetrated into the OLED display panel is less than $10^{-6}$ g/m²/day and the amount of oxygen penetrated is less than $10^{-3}$ cm³/m²/day. A sealing method usually includes the following steps of: in nitrogen atmosphere, placing a first substrate of the OLED display panel (this substrate is generally known as a packaging cover plate) on a base, and filling frit in a packaging region of the first substrate; aligning the second substrate with the first substrate to form a cell, and then heating the frit by a laser beam to melt the frit so that the molten frit forms a tight packaging connection between the first substrate and the second substrate.

At present, filling the frit in the packaging region of the packaging cover plate is usually done by means of thin film screen printing, as shown in FIG. 1. Specifically, a white glass plate is placed on a base (both the white glass plate and the base are not shown in the figures) first, and then the white glass plate and the thin film screen 12 are mechanically aligned with each other (with a spacing therebetween). Then, the frit 14 on the thin film screen 12 is printed onto the white glass plate by a scrapper 13, and the position of the frit 14 on the white glass plate is recorded. Next, a packaging cover plate 11 is prepared, and the position of the packaging region of the packaging cover plate 11 is aligned with the position of the frit 14 on the white glass plate recorded previously. That is, the packaging cover plate 11 is aligned with the thin film screen 12. Finally, the frit 14 on the thin film screen 12 is printed onto the packaging cover plate 11 by the scrapper 13.

However, the inventor finds that there are at least following problems in the prior art. Although the position of the packaging region of the packaging cover plate 11 is mechanically aligned with the position of the frit 14 on the white glass plate, deformation of the thin film screen 12 will inevitably occur with the increasing times of use of the thin film screen 12. In this case, the position of the frit 14 printed onto the packaging cover plate 11 through the thin film screen 12 will not be accurate. Furthermore, as the frit 14 has unsmooth lines due to the deformation of the thin film screen 12, burrs occur, and the packaging effect is influenced.

SUMMARY OF THE INVENTION

In view of the above problems of the existing thin film screens, the present invention provides a screen assembly, a screen printing system and a screen printing method, by which a pattern having smooth lines may be printed.

A technical solution adopted for solving the above technical problem is a screen assembly, comprising a thin film screen and a fixed screen both having a same pattern; wherein when a packaging cover plate is printed, the thin film screen is arranged above the fixed screen, and the fixed screen is arranged on the packaging cover plate, so that printing material passes through the thin film screen and the fixed screen successively to be printed onto the packaging cover plate.

Preferably, a non-stick coating is formed on surface of the fixed screen.

Further preferably, material of the non-stick coating is TEFLON.

Preferably, the fixed screen is made of glass or polyvinyl chloride.

A technical solution adopted for solving the above technical problem is a screen printing system, comprising the screen assembly described above.

Preferably, the screen printing system further includes a bearing base and an alignment device;

the bearing base is configured to bear a packaging cover plate onto which a pattern is to be printed, and the fixed screen is arranged on the packaging cover plate; and the alignment device is configured to align the packaging cover plate, the fixed screen and the thin film screen.

Further preferably, the alignment device comprises a reference glass plate, an image acquisition module and a position adjustment module;

the reference glass plate is configured to record a pattern on the thin film screen;

the image acquisition module is configured to acquire a pattern of the thin film screen recorded on the reference glass plate and images of the fixed screen and the packaging cover plate, in order to acquire position information of the pattern recorded on the reference glass plate and the position information of the fixed screen and the packaging cover plate and to transmit the position information to the position adjustment module; and the position adjustment module is configured to align the packaging cover plate, the fixed screen and the thin film screen according to the position information transmitted by the image acquisition module.

Further preferably, the image acquisition module includes a camera.

A technical solution adopted for solving the above technical problem is a screen printing method, comprising:

placing a thin film screen above a reference glass plate, printing a pattern on the thin film screen onto the reference glass plate, and recording position information of the pattern printed on the reference glass plate; and placing a fixed screen on a packaging cover plate, and aligning the thin film screen, the fixed screen and the packaging cover plate according to the recorded position information of the pattern printed on the reference glass plate.

Preferably, aligning the thin film screen, the fixed screen and the packaging cover plate further comprises:

aligning the fixed screen with the thin film screen according to the recorded position information of the pattern printed on the reference glass plate; and aligning the packaging cover plate with the thin film screen and the fixed screen according to the recorded position information of the pattern printed on the reference glass plate.

Preferably, after aligning the thin film screen, the fixed screen and the packaging cover plate, the method further comprises: printing the printing material onto the packaging cover plate through the thin film screen and the fixed screen.

Further preferably, the printing material is frit.

The present invention has the following beneficial effects:

In the screen assembly of the present invention, as a fixed screen having a same pattern as the thin film screen is additionally provided and the fixed screen is arranged on a packaging cover plate when the packaging cover plate is printed, the printing material can be accurately printed on a region to be printed on the packaging cover plate even if the thin film screen located above the fixed screen deforms during printing, thus avoiding the problem that the printed pattern has unsmooth lines due to the deformation of the thin film screen in the prior art.

DETAILED DESCRIPTION OF THE EMBODIMENTS

To make those skilled in the art understand the technical solution of the present invention better, the present invention will be further described as below with reference to the accompanying drawings and specific implementations.

First Embodiment

Figure 2:
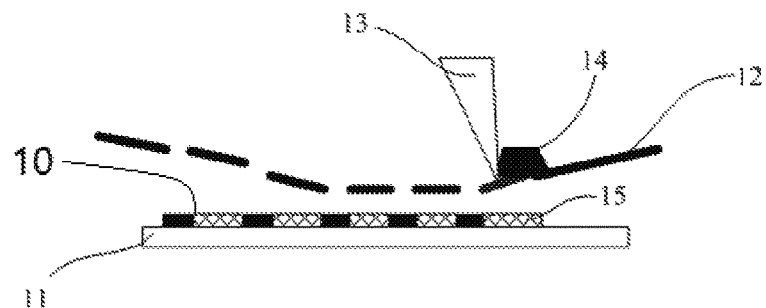
FIG. 2 is a schematic diagram of a screen assembly of a first embodiment of the present invention.

As shown in FIG. 2, this embodiment provides a screen assembly, comprising a thin film screen 12 and a fixed screen 15 both having a same pattern; wherein when a packaging cover plate 11 is printed, the fixed screen 15 is arranged on the packaging cover plate 11, for printing the printing material 14 onto the packaging cover plate 11 through the thin film screen 12.

In the screen assembly of this embodiment, as a fixed screen 15 having a same pattern as the thin film screen 12 is additionally provided and the fixed screen 15 is arranged on a packaging cover plate 11 when the packaging cover plate 11 is printed, the printing material 14 can be accurately printed on a region to be printed on the packaging cover plate 11 even if the thin film screen 12 deforms during printing, thus avoiding the problem that the printed pattern has unsmooth lines due to the deformation of the thin film screen 12 in the prior art.

Preferably, a non-stick coating 10 is formed on the surface of the fixed screen 15. The non-stick coating 10 can effectively prevent the printing material 14 from sticking onto the fixed screen 15 during printing of the printing material 14 onto the packaging cover plate 11. Hence, the printing effect is not influenced when the fixed screen 15 is separated from the packaging cover plate 11 after the end of printing.

Preferably, material of the non-stick coating is TEFLON. Of course, in this embodiment, the material of the non-stick coating is not limited to this one, and other material having a same function as TEFLON may be used.

Preferably, the fixed screen 15 in this embodiment is made of glass or polyvinyl chloride. Similarly, the material of the fixed screen 15 is not limited to the two, and the material of the fixed screen 15 is not specifically limited in this embodiment.

It should be noted that the screen assembly of this embodiment is particularly applicable to the printing process of materials such as a seal, wherein the seal is usually made of frit. That is, the printing material 14 may be frit. The thin film screen 12 in this embodiment is of the same material as the existing thin film screen 12, and may be made of a thin film of metal such as copper, aluminum, or the like. This is not exemplified here one by one.

Second Embodiment

Figure 3:
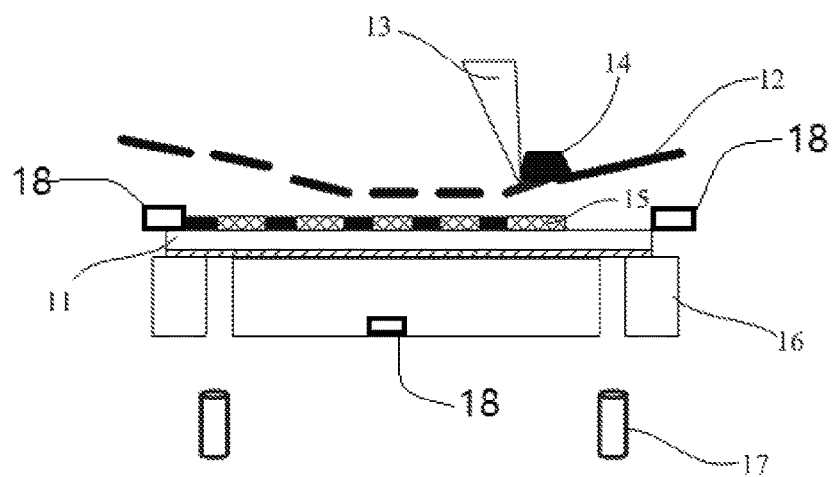
FIG. 3 is a schematic diagram of a screen printing system of a second embodiment of the present invention.

As shown in FIG. 3, this embodiment provides a screen printing system, including the screen assembly as described in the first embodiment, a bearing base 16 and an alignment device, wherein the bearing base 16 is configured to bear a packaging cover plate 11 onto which a pattern is to be printed, and the fixed screen 15 is arranged on the packaging cover plate 11; and the alignment device is configured to align the packaging cover plate 11, the fixed screen 15 and the thin film screen 12.

Figure 1:
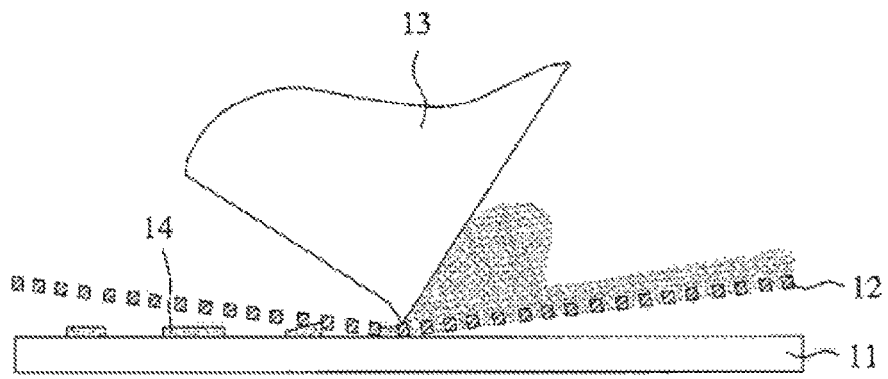
FIG. 1 is a schematic diagram of an existing thin film screen.

Specifically, the alignment device comprises a reference glass plate, an image acquisition module 17 and a position adjustment module 18. The reference glass plate is configured to record a pattern on the thin film screen 12, like the packaging cover plate 11 as shown in FIG. 1. The image acquisition module 17 is configured to acquire a pattern of the thin film screen 12 recorded on the reference glass plate and images of the fixed screen 15 and the packaging cover plate 11 onto which a pattern is to be printed, in order to acquire position information of the pattern (i.e., printing material 14) recorded on the reference glass plate and the position information of the fixed screen 15 and the packaging cover plate 11 onto which a pattern is to be printed, and to transmit the position information to the position adjustment module 18. The position adjustment module 18 is configured to align the packaging cover plate 11, the fixed screen 15 and the thin film screen 12 according to the position information transmitted by the image acquisition module 17. Preferably, the image acquisition module 17 includes a camera. It should be noted that, usually, in order to acquire the accurate positions of the packaging cover plate 11, the fixed screen 15 and the thin film screen 12, there are two cameras and the cameras are arranged below the bearing base 16. The reference glass plate may be a white glass plate.

Figure 4:
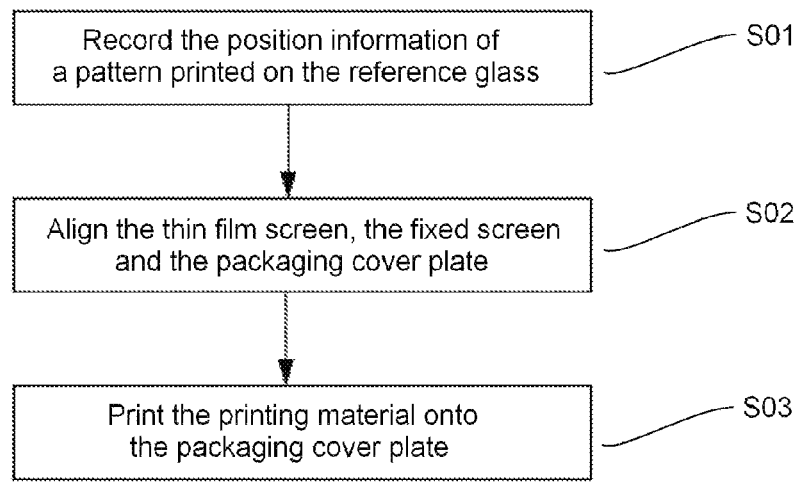
FIG. 4 is a schematic flow diagram of a screen printing method of the second embodiment of the present invention.

Correspondingly, this embodiment further provides a screen printing method for the screen printing system described above. FIG. 4 is a schematic flow diagram of this method which may include the following steps S01 and S02.

S01: a step of recording position information of a pattern printed on a reference glass plate. A thin film screen 12 is placed above a reference glass plate, a pattern on the thin film screen 12 is printed onto the reference glass plate, and position information on the position of the pattern printed on the reference glass plate is recorded.

Specifically, a reference glass plate is placed on the bearing base 16 first, and then the reference glass plate is mechanically aligned. Then, the printing material 14 on the thin film screen 12 is printed onto the reference glass plate by a scrapper 13, wherein there is a certain spacing between the thin film screen 12 and the reference glass plate. Finally, the pattern of the printing material 14 on the reference glass plate is acquired by the image acquisition module 17 (camera), in order to acquire the position information of the printing material 14 and to write this position information into the position adjustment module 18. The position information of the printing material 14 on the reference glass plate is the position information of the pattern on the thin film screen 12.

S02: a step of aligning the thin film screen, the fixed screen and the packaging cover plate. A fixed screen 15 and a packaging cover plate 11 are provided below the thin film screen 12 so that the fixed screen 15 is located on the packaging cover plate 11, and the thin film screen 12, the fixed screen 15 and the packaging cover plate 11 are aligned according to the recorded position information of the pattern printed on the reference glass plate.

Figure 5:
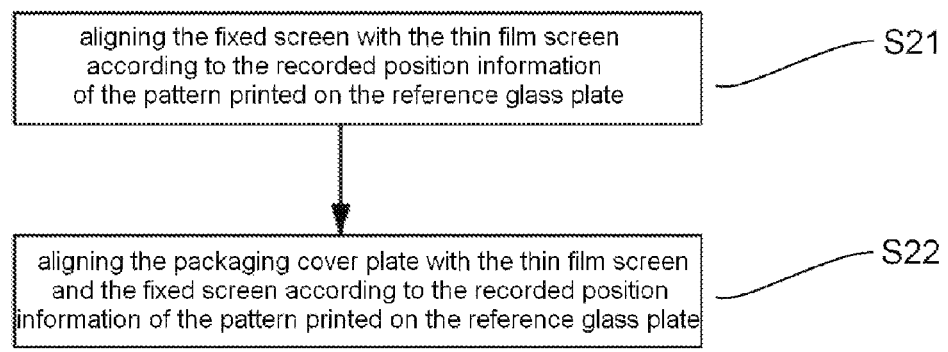
FIG. 5 is a schematic flow diagram of specific process of step S02 in the method as shown in FIG. 4.

As shown in FIG. 5, the step 02 may further comprises:

S21: aligning the fixed screen with the thin film screen according to the recorded position information of the pattern printed on the reference glass plate; and S22: aligning the packaging cover plate with the thin film screen and the fixed screen according to the recorded position information of the pattern printed on the reference glass plate.

Specifically, a fixed screen 15 is prepared and the fixed screen 15 is mechanically aligned with the thin film screen 12 subjected to the step S01. Then, an image of the fixed screen 15 is acquired by the image acquisition module 17 (camera), in order to acquire the position information of the fixed screen 15 and to write this position information into the position adjustment module. The position adjustment module precisely aligns the fixed screen 15 and the thin film screen 12 according to the recorded position information of the printing material 14 on the reference glass plate in S01 and the position information of the fixed screen 15. For example, the position information of the fixed screen 15 may be compared with the position information of the printing material 14, and the fixed screen 15 and the thin film screen 12 may be accurately aligned according to the result of comparison. In this case, the position of the fixed screen 15 is kept unchanged.

Next, the packaging cover plate 11 is arranged below the fixed screen 15 in such a manner that the packaging cover plate 11 comes into contact with the fixed screen 15, and then the packaging cover plate 11 and the fixed screen 15 are mechanically aligned. Then, an image of the packaging cover plate 11 is acquired by the image acquisition module 17 (camera), in order to acquire the position information of the packaging cover plate 11 and to write this position information into the position adjustment module. The position adjustment module precisely aligns the packaging cover plate 11 and the thin film screen 12 according to the recorded position information of the printing material 14 on the reference glass plate in S01 and the position information of the packaging cover plate 11. For example, the position information of the packaging cover plate 11 may be compared with the position information of the printing material 14, and the packaging cover plate 11 and the thin film screen 12 may be accurately aligned according to the result of comparison.

In this way, alignment of the packaging cover plate 11, the thin film screen 12 and the fixed screen 15 is accomplished.

After the above steps S01 and S02, a further step S03 may be further performed, as shown in FIG. 4.

S03: a step of printing the printing material onto the packaging cover plate. The printing material 14 on the thin film screen 12 is printed onto the packaging cover plate 11 through a scrapper 13.

This process is particularly applicable to the printing process of a seal. The printing material 14 may be, for example, frit.

By using the screen printing system and printing method provided by this embodiment, the printed pattern can have smooth lines, thereby avoiding the burrs in the printed pattern.

It may be understood that the above implementations are merely exemplary implementations used to describe the principle of the present invention, and the present invention is not limited thereto. For a person of ordinary skill in the art, various variations and improvements may be made without departing from the spirit and essence of the present invention, and these variations and improvements should also be regarded as falling into the protection scope of the present invention.

The invention claimed is:

1. A screen printing system, comprising a screen assembly, which comprises a thin film screen and a fixed screen both having a same pattern; wherein
    the fixed screen is made of one of glass and polyvinyl chloride; and
    when a packaging cover plate is printed, the thin film screen is arranged above the fixed screen, and the fixed screen is arranged on the packaging cover plate, so that printing material passes through the thin film screen and the fixed screen successively to be printed onto the packaging cover plate,
    wherein the screen printing system further comprises a bearing base and an alignment device; the bearing base is configured to bear a packaging cover plate onto which a pattern is to be printed, and the fixed screen is arranged on the packaging cover plate; and the alignment device is configured to align the packaging cover plate, the fixed screen and the thin film screen,
    wherein the alignment device comprises a reference glass plate, an image acquisition module and a position adjustment module;
    the reference glass plate is configured to record a pattern on the thin film screen;
    the image acquisition module is configured to acquire a pattern of the thin film screen recorded on the reference glass plate and images of the fixed screen and the packaging cover plate, in order to acquire position information of the pattern recorded on the reference glass plate and the position information of the fixed screen and the packaging cover plate and to transmit the position information to the position adjustment module; and
    the position adjustment module is configured to align the packaging cover plate, the fixed screen and the thin film screen according to the position information transmitted by the image acquisition module.

2. The screen printing system according to claim 1, wherein the image acquisition module includes a camera.

3. The screen printing system according to claim 2, wherein a non-stick coating is formed on surface of the fixed screen.

4. The screen printing system according to claim 1, wherein a non-stick coating is formed on surface of the fixed screen.

5. A screen printing method, comprising:
placing a thin film screen above a reference glass plate, printing a pattern on the thin film screen onto the reference glass plate, and recording position information of the pattern printed on the reference glass plate; and
placing a fixed screen on a packaging cover plate, and aligning the thin film screen, the fixed screen and the packaging cover plate according to the recorded position information of the pattern printed on the reference glass plate; wherein
the fixed screen is made of one of glass and polyvinyl chloride, wherein aligning the thin film screen, the fixed screen and the packaging cover plate further comprises:
aligning the fixed screen with the thin film screen according to the recorded position information of the pattern printed on the reference glass plate; and
aligning the packaging cover plate with the thin film screen and the fixed screen according to the recorded position information of the pattern printed on the reference glass plate.

6. The screen printing method according to claim 5, wherein after aligning the thin film screen, the fixed screen and the packaging cover plate, the method further comprises:
printing the printing material onto the packaging cover plate through the thin film screen and the fixed screen.

7. The screen printing method according to claim 6, wherein the printing material is frit.

* * * * *